United States Patent [19]

Muraki et al.

[11] Patent Number: 5,202,647
[45] Date of Patent: Apr. 13, 1993

[54] APPARATUS AND METHOD FOR GENERATING CLOCK PULSES HAVING A STABLE DUTY RATIO

[75] Inventors: Yoichi Muraki, Setsuo Hori, both of Shiga, Japan

[73] Assignee: Kyocera Corporation, Kyoto, Japan

[21] Appl. No.: 849,826

[22] Filed: Mar. 11, 1992

Related U.S. Application Data

[63] Continuation of Ser. No. 605,962, Oct. 29, 1990, abandoned.

[30] Foreign Application Priority Data

Oct. 31, 1989 [JP] Japan ................ 1-285595

[51] Int. Cl.$^5$ ................................... H03B 5/32
[52] U.S. Cl. ........................ 331/74; 307/261; 307/265; 328/28; 328/111; 331/158; 331/186
[58] Field of Search ............... 331/74, 75, 77, 116 R, 331/116 FE, 158, 186, DIG. 3; 307/261, 265; 328/28, 63, 111

[56] References Cited

U.S. PATENT DOCUMENTS

| | | | |
|---|---|---|---|
| 3,699,476 | 10/1972 | Mancini | 331/158 X |
| 4,060,772 | 11/1977 | Yamada et al. | 331/116 FE |
| 4,383,224 | 5/1983 | Saari | 331/74 |
| 4,871,982 | 10/1989 | Williams et al. | 331/75 |
| 4,999,588 | 3/1991 | Koch | 331/116 FE |

Primary Examiner—Siegfried H. Grimm
Attorney, Agent, or Firm—Spensley Horn Jubas & Lubitz

[57] ABSTRACT

An apparatus for generating clock pulses comprises a Colpitts-type quartz crystal oscillator having an inverter composed of a C-MOS integrated circuit, and a quartz-crystal resonator connected with said inverter, and an amplifying circuit for amplifying the output of said quartz-crystal oscillator and delivering clock pulses as output. A first resistor is provided between the input terminal of the inverter and the quartz-crystal resonator, and the input terminal of the inverter is connected with the input terminal of the amplifying circuit. The amplifying circuit is for connection with a load composed of TTL circuits. This amplifying circuit includes a capacitor for suppressing a direct-current bias voltage from the output of the oscillator, an inverter composed of a C-MOS integrated circuit for providing the clock pulses as output, and a negative feedback circuit which utilizes negative feedback to the inverter as a direct-current bias voltage corresponding to the duty ratio of the clock pulses. This apparatus may further comprise a power supply for supplying operation voltage to the amplifying circuit which matches that of the load.

24 Claims, 5 Drawing Sheets

| duty D | V₁ | R4/R5 | duty D | V₁ | R4/R5 |
|---|---|---|---|---|---|
| 0.1 | $V_{DD}$ | 0.951 | 0.5 | 0 | 0 |
| 0.2 | $V_{DD}$ | 0.809 | 0.6 | 0 | 0.309 |
| 0.3 | $V_{DD}$ | 0.588 | 0.7 | 0 | 0.588 |
| 0.4 | $V_{DD}$ | 0.309 | 0.8 | 0 | 0.809 |
| 0.5 | $V_{DD}$ | 0 | 0.9 | 0 | 0.951 |

APPARATUS AND METHOD FOR GENERATING CLOCK PULSES HAVING A STABLE DUTY RATIO

This is a continuation of application Ser. No. 07/605,962 filed on Oct. 29, 1990, now abandoned.

BACKGROUND OF THE INVENTION

The present invention relates to an apparatus for generating clock pulses. More specifically, it relates to an apparatus for generating clock pulses of which duty ratio remains stable despite temperature, load capacitance, or supply voltage changes.

Conventional computers use the rising timing of the clock pulses as the reference timing. However, a computer using both the rising and the falling timings of the clock pulses as the reference timing is being developed in order to increase operating speed. The resultant operation speed is twice that of conventional computers, while using clock pulses of conventional frequency. Whereas the rising and falling timing of the clock pulses are used for the reference timing, the clock pulses should have the duty ratio of exactly 50 percent which remains stable and is scarcely disturbed by ambient changes.

In order to obtain clock pulses having a duty ratio of 50 percent, an apparatus as shown in FIG. 9 has been employed. This apparatus is constituted of a crystal oscillator 5 and an amplifier Q2. The crystal oscillator 5 is a Colpitts-type quartz-crystal oscillator including an inverter Q1 made of a Complementary Metal Oxide Semiconductor (C-MOS) integrated circuit and a crystal resonator 1 in parallel with the inverter Q1. A resistor R and a capacitor C are adjustable, in order to effect a duty ratio of 50 percent.

In the apparatus shown in FIG. 9, the circuit must be manually adjusted, otherwise dispersive characteristics of the elements are such that accurate clock pulses having a 50-percent duty ratio will not be emitted.

Another conventional apparatus as shown in FIG. 10 includes an oscillator 2, for generating output having a frequency twice that of the desired clock pulses, and a flip-flop 3 for dividing the output from the oscillator 2 in half. There is propagation delay time in the flip-flop 3 of this apparatus which causes variation of the transition time from low to high level as opposed to the transition time from high to low level in the high frequency range, for example at 50 MHz. Furthermore, the propagation delay time usually changes depending upon the load capacitance of the apparatus. Consequently, clock pulses having an accurate 50-percent duty ratio are difficult to obtain.

Another quartz-crystal oscillator for making steady clock pulses having a 50-percent duty ratio is disclosed in U.S. Pat. No. 4,383,224. However, this apparatus does not sufficiently maintain 50-percent duty ratio, resulting from dispersive characteristics in its elements, and from changes in temperature, load capacitance and supply voltage.

SUMMARY OF THE INVENTION

It is an object of the present invention to provide an apparatus for generating clock pulses which outputs clock pulses of a duty ratio which is minimally disturbed by changes in temperature, load capacitance, or supply voltage.

It is another object of the present invention to provide an apparatus for generating clock pulses which outputs clock pulses having a 50-percent duty ratio which is minimally disturbed by changes in temperature, load capacitance, or supply voltage.

It is a further object of the present invention to provide an apparatus for generating clock pulses which outputs clock pulses of a stable duty ratio.

It is yet another object of the present invention to provide an apparatus for generating clock pulses which outputs clock pulses of a stable duty ratio in correspondence with the operating voltage of a load which is connected with the apparatus.

It is a further object of the present invention to provide an apparatus for generating, with a small amount of power-supply current, clock pulses of a duty ratio which is minimally disturbed by changes in temperature, load capacitance, or supply voltage.

(1) According to an embodiment of the present invention, an apparatus for generating clock pulses comprises a Colpitts-type quartz-crystal oscillator having an inverter made of a complementary metal oxide semiconductor (referred to as a C-MOS below) integrated circuit and a quartz-crystal resonator connected with the input and output terminals of the inverter; and an amplifier for amplifying the output of the quartz-crystal oscillator and the output clock pulses. A resistor is provided between the input terminal of the inverter and the quartz-crystal resonator in the oscillator. The input terminal of the amplifier is connected with the input terminal of the inverter.

Since the output of the oscillator is taken at the input terminal of the inverter, the Colpitts-type quartz-crystal oscillator delivers a steady sine-wave output having a 50-percent duty ratio. Moreover, the resistance between the input terminal of the inverter and the quartz-crystal resonator reduces the effects of the impedance of the succeeding amplifiers. Furthermore, the resistance decreases the driving level of the quartz-crystal resonator, alternating the strength of oscillation, whereby a stable sine-wave output is generated.

The output is amplified by the following amplifier. The amplifier then delivers clock pulses of 50-percent duty ratio to which disturbance by changes in temperature, load capacitance or supply voltage is minimized.

(2) According to another embodiment of the present invention, an apparatus for generating clock pulses comprises an oscillator for delivering a sine wave as oscillating output, and an amplifier for amplifying the output of the oscillator and providing clock pulses. The amplifier includes a capacitor which suppresses direct current from the output of the oscillator, an amplifying circuit for amplifying the signals through the capacitor, and a negative feedback circuit for adding to the amplifying circuit a direct-current bias voltage dependent upon the duty ratio of the clock pulses delivered by the amplifier.

In the amplifier, the direct current in the output from the oscillator is suppressed by the capacitor. Then, a bias voltage dependent upon the duty ratio of the clock pulses is added to the signal through the capacitor. Consequently, if the duty ratio varies due to load change, the variation is automatically compensated, thereby stabilizing the duty ratio of the clock pulses.

(3) According to yet another embodiment of the present invention, an apparatus for generating clock pulses comprises an oscillator for delivering a sine wave as oscillation output, and an amplifier for amplifying the output from the oscillator and providing clock pulses. The amplifier includes a capacitor for suppressing a direct current from the output of the oscillator, an amplifying circuit for amplifying the signals through the capacitor, and a circuit for adding a direct-current bias voltage to the amplifying circuit.

The circuit for adding the direct-current bias voltage may have a second amplifying circuit; and the first and second amplifying circuits may be formed in one integrated circuit.

According to this embodiment, a direct current in the output from the oscillator is suppressed by the capacitor included in the amplifier. Then, the bias voltage generated by the amplifier is added to the signal through the capacitor.

By regulating the direct-current bias voltage to be added to the output from the oscillator, a given clock-pulse duty ratio may be obtained. Wherein the direct-current adding circuit includes a second amplifying circuit formed within the integrated circuit in which the first amplifying circuit is formed, clock pulses having stable duty ratio are obtained, since both amplifying circuits have an identical threshold voltage, whereby dispersion of the threshold voltage in the first amplifying circuit is compensated by an identical dispersion of the threshold voltage in the second amplifying circuit.

(4) A further embodiment of the present invention defines an apparatus which generates clock pulses for supplying a load which includes transistor-transistor logic (TTL) circuits. The apparatus comprises an oscillator, an amplifier including a C-MOS for amplifying the output of the oscillator and the output clock pulses, and a power supply for supplying a voltage to the amplifier which matches its operation voltage to that of the load.

The operation voltage, thereof, is a voltage twice that of a half voltage of the input signals to the amplifier, or to the load. For example, the operation voltage should be 3V if the load consists of TTL circuits of which the half voltage is 1.5V.

In this apparatus, the power supply supplies a voltage to the amplifier such that the operation voltage of the amplifier is the same as that of the load. In this case, since clock pulses which have a voltage level corresponding to that of the load are provided to the load, the stability of the clock-pulse duty ratio in the load is maintained. Furthermore, since the voltage to the amplifiers is lower in correspondence with the voltage level of the load, the power supply current is reduced, in contrast to conventional cases, wherein the voltage to the load is lowered subsequent to ordinarily higher amplification.

These and other objects and advantages of the present invention will be more fully apparent from the following the detailed description.

DESCRIPTION OF THE PREFERRED EMBODIMENT

Embodiment for Obtaining 50-percent Duty Ratio

Figure 1:
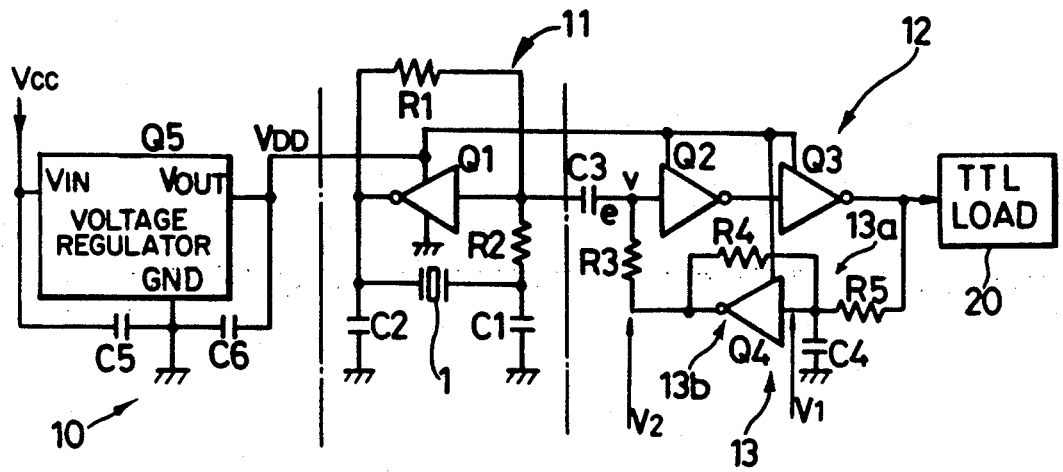
FIG. 1 is a circuit diagram showing an apparatus for generating clock pulses according to an embodiment the present invention.

FIG. 1 shows an apparatus for generating clock pulses according to an embodiment of the present invention.

The apparatus is for generating clock pulses having a 50-percent duty ratio. It comprises a voltage regulator 10, a quartz-crystal oscillator 11 composed of a C-MOS, and a pulse amplifier 12 composed of a C-MOS. Clock pulses emitted from the pulse amplifier 12 are to be fed to a load 20 consisting of TTL circuits, such as a computer. The voltage $V_{DD}$ is made by lowering the supply voltage $V_{CC}$ (5 V) with the voltage regulator 10 to the level corresponding to the operation voltage (3 V) of the load 20 consisting of TTL circuits.

The voltage regulator 10 includes an integrated-circuit regulator Q5, and capacitors C5 and C6 as noise filters. The voltage regulator 10 is for supplying the regulated voltage $V_{DD}$ to the quartz-crystal oscillator 11 and the pulse amplifier 12.

The quartz-crystal oscillator 11 is a Colpitts-type quartz-crystal oscillator having a C-MOS inverter Q1, and a quartz-crystal resonator 1 connected to the input and output terminals of the inverter Q1. Provided between the input and output terminals of the inverter Q1 is a resistor R1 for feedback. Capacitors C1 and C2 are provided between both ends of the quartz-crystal resonator 1 and ground which, together with the resistor R1, stabilize oscillations. A resistor R2 is provided between the input terminal of the inverter Q1 and the quartz-crystal resonator 1, to lower the driving level to the quartz-crystal resonator 1, whereby its oscillation strength is attenuated. The output of the oscillator 11 is delivered from the input terminal of the inverter Q1 in the form of a sine wave.

The pulse amplifier 12 has input capacitor C3, inverters Q2 and Q3 for amplifying the output from the oscillator 11 through the capacitor C3, and a negative feedback circuit 13 for generating a direct-current bias voltage dependent upon the duty ratio of the clock pulses. The negative feedback circuit 13 includes a low-pass filter 13a for filtering the clock pulses delivered from the inverter Q3, a direct-current amplifier 13b for amplifying the output from the low-pass filter 13a, and a resistor R3 provided between the direct-current amplifier 13b and the inverter Q2. The low-pass filter 13a is an integrating circuit consisting of a resistor R5 and a capacitor C4. The direct-current amplifier 13b includes an inverter Q4, and a resistor R4 provided between the input and output terminals of the inverter Q4. The resistor R4 has a resistance appropriately lower than that of the resistor R5.

Figure 2:
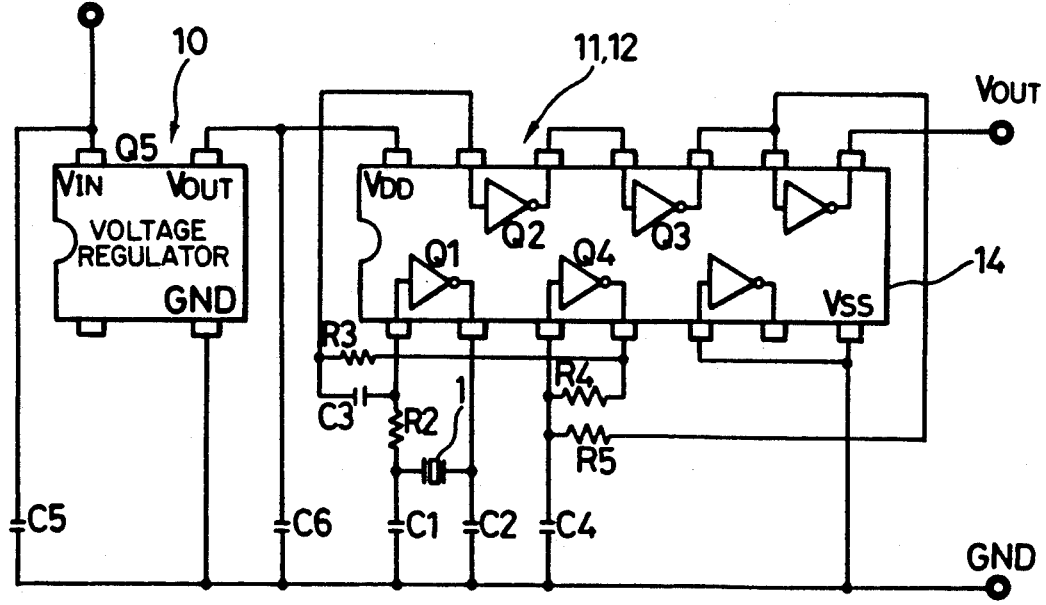
FIG. 2 is a circuit diagram showing locations of inverters.

FIG. 2 is a circuit diagram showing the positions of the inverters of the apparatus illustrated in FIG. 1. The numerals in FIG. 2 correspond to those in FIG. 1. The inverters Q1 to Q4 in the quartz-crystal oscillator 11 and the pulse amplifier 12 are formed in one IC chip 14, so that the inverters Q1 to Q4 receive the same driving voltage $V_{DD}$.

The operation of the foregoing apparatus will be described in the following.

The operation of the quartz-crystal oscillator 11 is the same as that of conventional oscillators. That is, as a power switch (not shown) is turned on, noise generated in the quartz-crystal oscillator 11 is amplified by inverter Q1. Then, the quartz-crystal resonator 1 as a frequency-selecting element selects a frequency from the amplified noise corresponding to the resonance frequency of the quartz-crystal resonator 1, and the selected frequency is further amplified by inverter Q1, producing oscillations. During this operation, resistor R2 between the input terminal of inverter Q1 and the quartz-crystal resonator 1 attenuates, the oscillation strength and narrows dispersion of the output frequency due to load change. Thus, a sine wave of steady 50-percent duty ratio is generated at the input terminal of the inverter Q1.

The sine-wave output of the quartz-crystal oscillator 11 generated at the input terminal of the inverter Q1 drives the pulse amplifier 12. The output driving the pulse amplifier 12 is transformed, inasmuch as direct current in the output is suppressed by the capacitor C3. The transformed signal e is:

$$e = E_m \sin(2\pi t/T)$$

Figure 3:
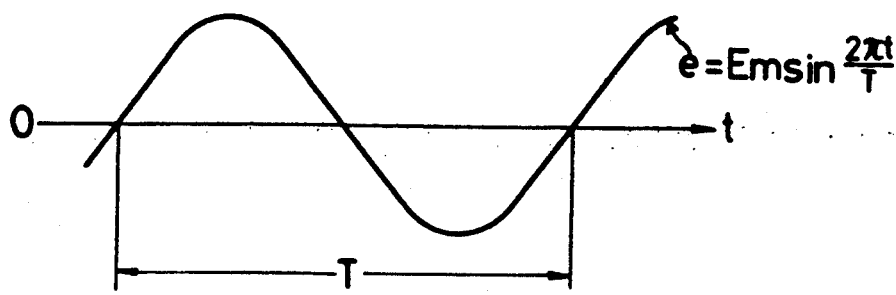
FIGS. 3 and 4 are graphs showing waveforms and outputted clock pulses of the apparatus of FIG. 1.
Figure 4:
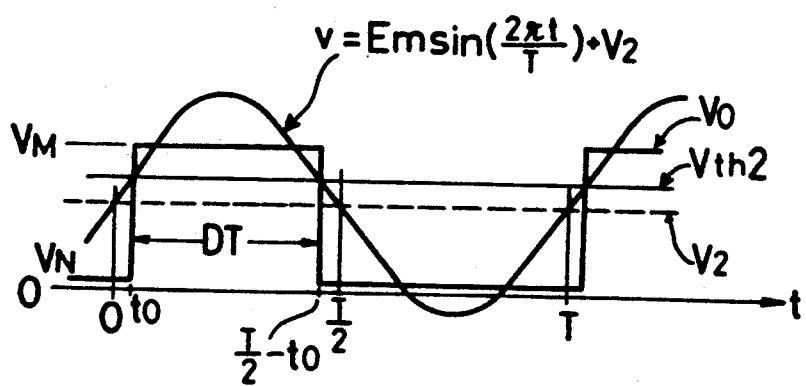

Then, a direct-current bias voltage formed by negative feedback circuit 13 (described below) is added through the resistor R3 to the signal e, to obtain a signal v for driving the inverter Q2. FIGS. 3 and 4 show waveforms of the signals e and v.

The signal v is inversely amplified by the inverter Q2 and the inverter Q3, successively. FIG. 4 shows a waveform $V_0$ composed of the clock pulses delivered by inverter Q3. The obtained clock pulses are provided to a load 20 consisting of TTL circuits, such as a computer.

Meanwhile, the supply voltage $V_{DD}$ of the amplifier 12 is lowered from the supply voltage $V_{CC}$ (5 V) to the voltage in correspondence with the operation voltage (3 V) of the load 20, consisting of TTL circuits. Consequently, the voltage of the output clock pulses, having voltage $V_M$, matches the operation voltage of the load consisting of TTL circuits, whereby a 50-percent clock-pulse duty ratio is maintained in the TTL-circuit load 20. That is, the pulse amplifier 12 provides clock pulses compatible with the TTL-circuit load 20. Additionally, the power supply current is reduced, since amplifier 12 carries out amplification at lower voltage than that of conventional apparatuses.

The operation of the negative feedback circuit 13 will be described. When resistor R5 and capacitor C4 have a time constant very much greater than period T, the direct-current voltage V1 generated at the low-pass filter 13a of the negative feedback circuit 13 is calculated by the following formula:

$$V1 = \{DTV_M + (T - DT)V_N\}/T \quad (1)$$
$$= D(V_M - V_N) + V_N$$

where D signifies the duty ratio, $V_M$ signifies the high level of the clock-pulse wave $V_O$, and $V_N$ signifies the low level of the clock-pulse wave $V_O$. In the case in which $V_N=0$ in formula (1), the voltage V1 is given by $$V1 = DV_M \quad (1)'$$

The output voltage V2 of the direct-current amplifier 13b is given by $$V2 = (1 + R4/R5)V_{th}4 - (R4/R5)V1 \quad (2)$$

where $V_{th}4$ signifies the threshold voltage of the inverter Q4. R4/R5 can be denoted by a constant k. Substituting formula (1)' into formula (2), $$V2 = (1+k)V_{th}4 - kDV_M \quad (3)$$

Accordingly, the input voltage v of the inverter Q2 is given by:

$$v = e + V2$$

where e is the output sine wave $$= E_m \sin(2\pi t/T) + (1+k)V_{th}4 - kDV_M \quad (4)$$

Assuming that the time t is $t_O$ when the voltage v equals the threshold voltage $V_{th}2$ of the inverter Q2, the voltage of the clock-pulse wave $V_O$ is switched from either the high level at $V_M$ or the low level at $V_N$ to the other. That is, at the timing at which the following formula (5) is satisfied, the voltage level of the clock-pulse wave $V_O$ is switched:

$$E_m \sin(2\pi t_O/T) + (1+k)V_{th}4 - kDM_M = V_{th}2 \quad (5)$$

It is readily understood, referring to FIG. 4, that the relation between the time $t_O$ and the duty ratio D is given by $$DT = T/2 - 2 t_o \quad (6)$$

or $$t_O/T = \tfrac{1}{4} - D/2 \quad (7)$$

In order to obtain the duty ratio D, formula (7) is substituted into formula (5). This results in $$E_m \sin(\pi/2 - \pi D) + (1+k)V_{th}4 - kDV_M - V_{th}2 = 0$$

Substituting $\Delta V_{th}$ for $(V_{th}2 - V_{th}4)$ and $V_{th}$ for $V_{th}2$, the above formula is rearranged into $$E_m \cos(\pi D) - \Delta V_{th} + k(V_{th} - DV_M) = 0 \quad (7)'$$

Then, $$\cos(\pi D) - \Delta V_{th}/E_m + (kV_M/E_m)(V_{th}/V_M - D) = 0 \quad (8)$$

Substituting U for $\Delta V_{th}/E_m$, T for $V_{th}/V_M$, and K for $kV_M/E_m$, formula (8) is rewritten $$\cos(\pi D) - U + K(T - D) = 0 \quad (9)$$

Figure 5:
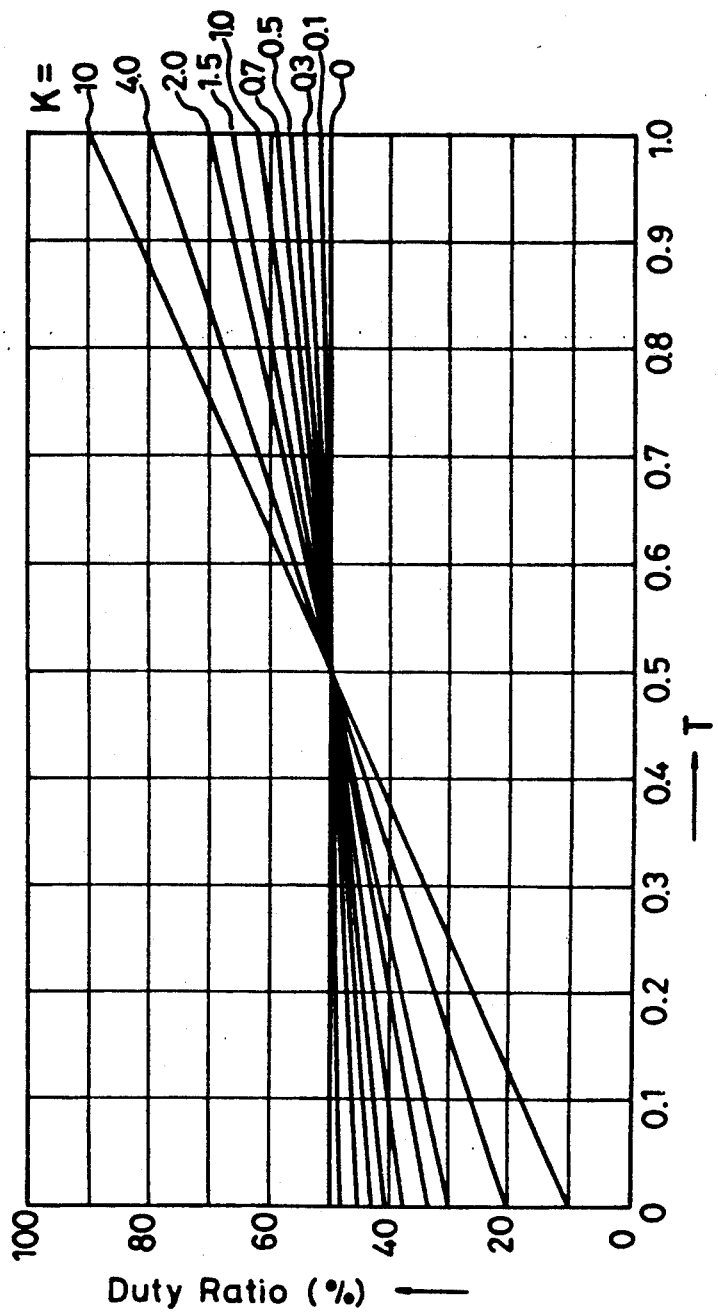
FIG. 5 is a graph showing the variation in the duty ratio of the apparatus of FIG. 1.

Since the inverter Q2 and the inverter Q4 are formed in one chip, it can be assumed that the difference in threshold voltage $\Delta V_{th}$ is zero, and then U=0. The results of formula (9) solved for various values of K are shown in FIG. 5. Referring to FIG. 5, if k is set smaller and $E_m$ is set larger, the duty ratio D becomes close to 50 percent, and if k=0, or K=0, the duty ratio D will be constant at 50 percent. When K is close to zero, the 50-percent duty ratio can be maintained even if the period T changes.

In the foregoing embodiment, since the resistor R4 is of sufficiently low resistance such that k can be assumed to be zero, K becomes zero. Accordingly, $$\cos(\pi D) = 0$$

and $$D = 0.5$$

That is, the duty ratio is constant at 50 percent.

The following advantages are assumed according to the embodiment:

(a) Since the output of the quartz-crystal oscillator 11 is at the input terminal of inverter Q1, the output signal becomes approximately a sine wave which corresponds to signals of a 50-percent duty ratio. This sine-wave output is amplified by the pulse amplifier 12, whereby clock pulses of accurate 50-percent duty ratio are obtained.

(b) The resistor R2 lowers the driving level of the quartz-crystal resonator 1 in order to weaken the oscillation strength, whereby a sine wave is readily generated.

(c) In the pulse amplifier 12, a direct-current bias voltage is suppressed from the output of the quartz-crystal oscillator 11 by the capacitor C3, then the direct-current bias voltage from the negative feedback circuit 13 is added to the signal through the capacitor C3. Thereby, dispersion of the duty ratio of the clock pulses is fed back to the input terminal of inverter Q2, whereby the dispersion of the duty ratio is automatically compensated.

(d) Since inverters Q2 and Q3, which amplify the oscillating signal, and inverter Q4, which amplifies the direct current added to the oscillating signal, are formed within one chip, dispersion of the duty ratio due to the dispersion of the threshold voltage is compensated.

(e) The quartz-crystal oscillator 11 and the pulse amplifier 12 formed in a C-MOS are driven with a voltage which corresponds to that of TTL circuits. Therefore, clock pulses having a stable duty ratio of 50 percent at the TTL voltage level are compatible with a TTL load such as a computer.

(f) Since the quartz-crystal oscillator 11 and the pulse amplifier 12 are driven at the relatively low voltage required by TTL circuits, the power supply current demanded by the apparatus is reduced. Additionally, electromagnetic interference is attenuated.

Embodiment for Obtaining Arbitrary-Percent Duty Ratio

An apparatus having elements similar to those of the above embodiment for obtaining clock pulses of 50-percent duty ratio can generate clock pulses having any stable duty ratio desired.

Figures 6, 7:
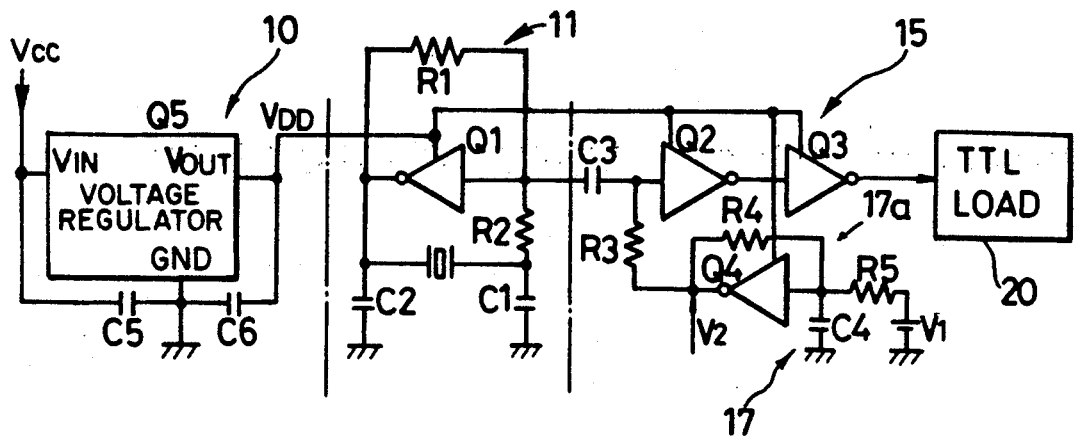
FIG. 6 is a circuit diagram showing another apparatus for generating clock pulses.
FIG. 7 is a table showing the relationship between supply voltage and duty ratio for an apparatus as shown in FIG. 6.

Such an apparatus is illustrated in FIG. 6. It comprises a voltage regulator 10, a quartz-crystal oscillator 11 composed of a C-MOS, and a pulse amplifier 15 composed of a C-MOS and formed within the chip in which the C-MOS of the quartz-crystal oscillator 11 is formed. The voltage regulator 10 and the quartz-crystal oscillator 11 are identical to those in the aforementioned embodiment.

The pulse amplifier 15 includes an input capacitor C3, inverters Q2 and Q3 for pulse amplification, a circuit 17 for generating a direct-current bias voltage which is added to the input signal of the inverter Q2, and a resistor R3 provided between the bias-voltage generating circuit 17 and the input terminal of the inverter Q2. The circuit 17 has an inverter Q4 and resistors R4 and R5 as a direct-current amplifying circuit 17a, a capacitor C4 for filtering noise, and a direct-current power source V1.

Pulse amplifier 15 operates in almost the same manner as pulse amplifier 12 (FIG. 1).

Formulas (1) to (8) can be rearranged to make a formula for calculating a duty ratio of this embodiment by substituting V1 for $DV_M$. Formula (7)' then becomes $$E_m \cos(\pi D) - \Delta V_{th} + k(V_{th} - V1) = 0$$

Inverters Q2 and Q4 are formed in one chip, so that the threshold voltage of the inverters may be assumed to be the same. Consequently, since $\Delta V_{th} = 0$, as explained in the description of the aforementioned embodiment, the above formula can be rearranged into $$\cos(\pi D) = k(V1/E_m - V_{th}/E_m) \qquad (11)$$

where k = R4/R5.

Various clock pluses having any desired duty ratio can be generated by setting the value of R4/R5 and V1 accordingly. Examples of the relation between R4/R5 and the duty ratio D are shown in FIG. 7, where $V_{DD} = 3$ V, $V_{th} = 1.5$ V, and $E_m = 1.5$ V.

It is possible to obtain the 50-percent duty ratio by removing the resistor R5 and the direct-current power source V1 from the circuit shown in FIG. 7, in which case R4/R5 = 0, in spite of the resistance of the resistor R4.

Other Embodiments (a) The resistor R4 may be removed in the embodiment of FIG. 1 so that the input and output terminals of the inverter Q4 are directly connected with each other. This results in providing a 50-percent duty ratio.

Figure 8:
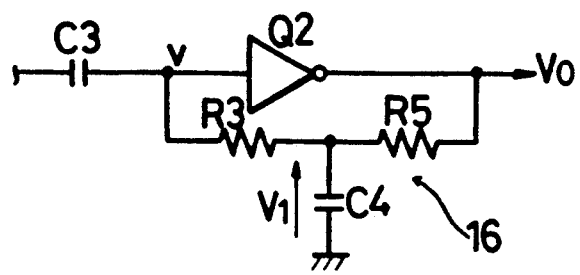
FIG. 8 is a circuit diagram showing a modification of the embodiment shown in FIG. 1.
Figure 9:
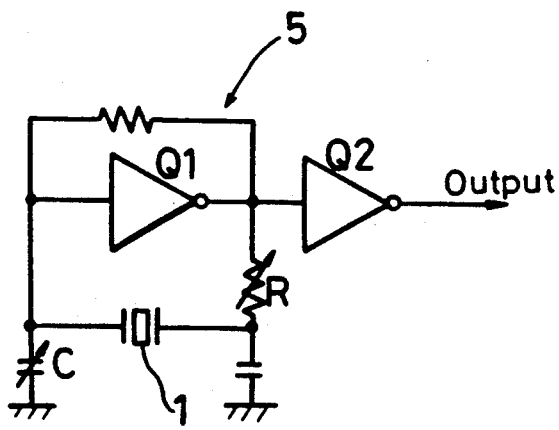
FIGS. 9 and 10 are circuit diagrams showing conventional apparatuses for generating clock pulses.
Figure 10:
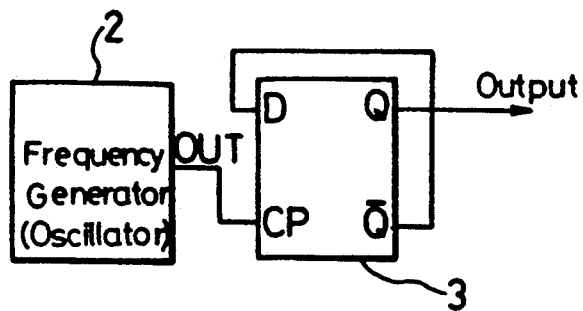

(b) FIG. 8 shows a modification of the pulse amplifier 12 of FIG. 1 having no direct-current amplifying circuit in the negative feedback circuit.

In this circuit, the output terminal of the inverter Q2 is connected through a low-pass filter 16, consisting of a resistor R5, a capacitor C4 and a resistor R3, to the input terminal of inverter Q2.

The circuit cannot compensate the dispersion of the threshold voltage of inverter Q2, but it controls the mean voltage of the input waveform of the inverter, which is inversely dependent upon the duty ratio of the clock pulses, since voltage inversely corresponding to the duty ratio of the clock pulses is supplied to the input terminal of inverter Q2. Thus, the dispersion of the duty ratio of the output clock pulses is compensated, whereby clock pulses having a stable duty ratio are obtained.

(c) The negative feedback operation of the negative feedback circuits 13 or 17 is realized even if the quartz-crystal circuit has an amplifier different from C-MOS inverters. Additionally, the operation of the direct-current bias generating circuit 17 which can set any duty ratio desired may be realized with the aforementioned quartz-crystal circuit.

(d) If the load is composed of C-MOS circuits, the supply voltage $V_{DD}$ of the voltage regulator 10 would be 5 V.

Various details of the invention may be changed without departing from its spirit nor its scope. Furthermore, the foregoing description of the embodiments according to the present invention is provided for the purpose of illustration only, and not for the purpose of limiting the invention as defined by the appended claims and their equivalents.

What is claimed is:

1. An apparatus for generating clock pulses comprising:
    an output terminal for providing clock pulse output signals;
    an oscillator having an inverter and a resonator connected in parallel with said inverter; and
    an electronic circuit electrically coupled between the oscillator and the output terminal, the electronic circuit having:
    a direct-current bias voltage circuit electrically coupled, to the output of the oscillator so as to add a direct-current bias signal to the output of the oscillator to provide an added output signal; and
    an amplifier for amplifying the added output signal and outputting said clock pulses, said amplifier having an input terminal electrically coupled with the input terminal of said inverter.

2. An apparatus according to claim 1, wherein said oscillator further has a first resistor provided between the input terminal of said inverter and said resonator.

3. An apparatus for generating clock pulses comprising:
    a Colpitts-type quartz-crystal oscillator having an inverter including a C-MOS integrated circuit, a quartz-crystal resonator connected in parallel with said inverter and a first resistor provided between the input terminal of said inverter and said quartz-crystal resonator; and
    amplifying means for amplifying the output of said quartz-crystal oscillator and outputting said clock pulses, said amplifying means having an input terminal electrically coupled with the input terminal of said inverter;
    wherein said amplifying means further has:
    means for suppressing direct-current bias voltage from the output of said oscillator;
    first amplifying means for amplifying a signal from said means for suppressing, and providing said clock pulses as output; and
    means for providing a negative feedback of a direct-current bias voltage to said first amplifying means, wherein the negative feedback direct-current bias voltage is dependent upon the duty ratio of said clock pulses.

4. An apparatus according to claim 3, wherein said negative-feedback means has integrating means for integrating the output of said first amplifying means, and a second resistor provided between said integrating means and the input terminal of said first amplifying means.

5. An apparatus according to claim 4, wherein said negative-feedback means further has a direct-current amplifying circuit between said integrating means and said second resistor, for amplifying the output of said integrating means.

6. An apparatus according to claim 5, wherein said direct-current amplifying circuit has a second amplifying means, and said first and second amplifying means are formed within one integrated circuit.

7. An apparatus according to claim 6, wherein said inverter of said oscillator and said first and second amplifying means are constituted by a plurality of inverters formed within one integrated circuit.

8. An apparatus according to claim 1, wherein said amplifier has an inverter formed of a C-MOS integrated circuit for connection with a load composed of a TTL circuit.

9. An apparatus according to claim 8 further comprising a power supply for supplying to said amplifying means an operating voltage which matches that of said load; wherein said amplifying means is to receive said operating voltage from said power supply.

10. An apparatus for generating clock pulses comprising:
    an oscillator having an inverter and a resonator connected in parallel with said inverter;
    an amplifier for amplifying the output of said oscillator and outputting said clock pulses, the amplifier having an input terminal connected with the input terminal of said inverter; and
    a power supply connected to supply an operating voltage to said amplifier, said power supply comprises a voltage regulator including a voltage-regulating integrated circuit and a capacitor for removing noise.

11. An apparatus for generating clock pulses comprising:
    a Colpitts-type quartz-crystal oscillator having an inverter including a C-MOS integrated circuit, a quartz-crystal resonator connected in parallel with said inverter and a first resistor provided between the input terminal of said inverter and said quartz-crystal resonator; and
    amplifying means for amplifying the output of said quartz-crystal oscillator and outputting said clock pulses, having an input terminal connected with the input terminal of said inverter;
    wherein said amplifying means further has:
    means for suppressing direct-current bias voltage from the output of said oscillator;
    means for generating a direct-current bias voltage to be added to the signal from said suppressing means; and
    a first amplifying means for receiving said added signal and amplifying it.

12. An apparatus according to claim 11, wherein said direct-current bias generating means includes a direct-current power supply, and a direct-current amplifying means for amplifying the supply voltage of said direct-current power supply.

13. An apparatus according to claim 12, wherein said direct-current amplifying means includes a second amplifying means, and said first and second amplifying means are formed within one integrated circuit.

14. An apparatus for generating clock pulses comprising:
    an oscillator for delivering a sine-wave signal; and
    amplifying means for amplifying the sine-wave signal of said oscillator and providing said clock pulses as output, having means for suppressing a direct-current bias voltage from the signal of said oscillator, first amplifying means for amplifying a signal from said suppressing means and providing said clock pulses as output, and negative feedback means for utilizing the negative feedback to said first amplifying means as a direct-current bias voltage corresponding to the duty ratio of said clock pulses of said first amplifying means.

15. An apparatus according to claim 14, wherein said negative feedback means includes integrating means for integrating the output of said first amplifying means, and a resistor provided between said integrating means and the input terminal of said first amplifying means.

16. An apparatus according to claim 15, wherein said negative feedback means further includes a direct-current amplifying means provided between said integrating means and said resistor, for amplifying the output of said integrating means.

17. An apparatus according to claim 16, wherein said direct-current amplifying means includes a second amplifying means, and said first and second amplifying means are formed within one integrated circuit.

18. An apparatus for generating clock pulses comprising:
    an oscillator for delivering a sine-wave signal including a first direct current bias voltage; and
    an amplifying means coupled in series with the oscillator, for amplifying the sine-wave signal of said oscillator and providing said clock pulses as output, the amplifying means having means for suppressing the first direct-current bias voltage from the sine-wave signal of said oscillator, a direct-current bias generating means for generating a second direct-current bias signal and for providing an added output by adding the second direct-current bias signal to the sine-wave signal from the oscillator, and first amplifying means for amplifying said added output.

19. An apparatus according to claim 18, wherein said direct-current bias generating means includes a direct-current power supply, and direct-current amplifying means including a second amplifying means formed in an integrated circuit within which said first amplifying means is formed, for amplifying the power supply voltage of said direct-current power supply.

20. An apparatus as claimed in claim 1, wherein said amplifier has an input side connected to the output of said oscillator and an output side for outputting said clock pulses and wherein the direct-current bias voltage circuit comprises a negative feedback circuit connected between said input side and output side of said amplifier.

21. An apparatus as claimed in claim 20, wherein said negative feedback circuit comprises means for generating a direct-current bias voltage dependant on the duty ratio of said clock pulses.

22. An apparatus as claimed in claim 1, wherein said oscillator comprises a Colpitts-type quartz-crystal oscillator and wherein said inverter comprises a C-MOS integrated circuit.

23. A method of generating clock pulses comprising the steps of:
    providing a signal having a sine-wave component and a first direct-current bias voltage component from the output of an oscillator;
    suppressing the first direct-current bias voltage component of the oscillator output;
    adding a second direct-current bias voltage with the oscillator output to provide an added signal; and
    amplifying the added signal with an amplifier.

24. A method as claimed in claim 23, wherein:
    the oscillator comprises an inverter and a resonator connected in parallel with the inverter, the inverter having an input terminal; and
    the amplifier has an input terminal connected with the input terminal of the inverter.

* * * * *